US009813038B2

(12) United States Patent
Liao et al.

(10) Patent No.: US 9,813,038 B2
(45) Date of Patent: Nov. 7, 2017

(54) METHOD AND APPARATUS FOR AUTOMATIC GAIN CONTROL

(71) Applicant: Telefonaktiebolaget LM Ericsson (publ), Stockholm (SE)

(72) Inventors: Jichang Liao, Beijing (CN); Ning Sun, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/029,977

(22) PCT Filed: Oct. 17, 2013

(86) PCT No.: PCT/CN2013/085372
§ 371 (c)(1),
(2) Date: Apr. 15, 2016

(87) PCT Pub. No.: WO2015/054860
PCT Pub. Date: Apr. 23, 2015

(65) Prior Publication Data
US 2016/0301374 A1    Oct. 13, 2016

(51) Int. Cl.
*H04B 7/00* (2006.01)
*H03G 3/30* (2006.01)
(Continued)

(52) U.S. Cl.
CPC ......... *H03G 3/3052* (2013.01); *H03G 3/3036* (2013.01); *H04W 24/04* (2013.01);
(Continued)

(58) Field of Classification Search
CPC ...... H03G 3/3052; H03G 3/3068; H03G 3/22; H04W 88/08
(Continued)

(56) References Cited

U.S. PATENT DOCUMENTS 4,631,489 A    12/1986    Laird et al.
6,670,901 B2   12/2003    Brueske et al.
(Continued)

FOREIGN PATENT DOCUMENTS

CN    1697440 A    11/2005
CN    1738196 A    2/2006
(Continued)

OTHER PUBLICATIONS

Alegre, J. P. et al., "A Fast Compact CMOS Feedforward Automatic Gain Control Circuit", IEEE International Symposium on Circuits and Systems, 2008, 1504-1507.
(Continued)

*Primary Examiner* — Danh Le
(74) *Attorney, Agent, or Firm* — Murphy, Bilak & Homiller, PLLC

(57) ABSTRACT

The embodiments disclose a method and apparatus for automatic gain control. The apparatus comprises a first gain controlled element, a second gain controlled element, a first gain control device, a second gain control device and a first simulator. The first gain controlled element and the second gain controlled element each has a signal input, a gain control input and a signal output. The first gain controlled element and the second gain controlled element are coupled in series and one or more power elements coupled between the first gain controlled element and the second gain controlled element. The signal input of the first gain controlled element constitutes an input of the automatic gain control apparatus. The first gain control device has a pre-detection input which is coupled to the signal input of the first gain controlled element and an output which drives the gain control input of the first gain controlled element. The second gain control device has a pre-detection input and an output which drives the gain control input of the second gain controlled element. The first simulator is coupled between the signal input of the first gain controlled element and the pre-detection input of the second gain control device, which
(Continued)

is used to simulate frequency response of the one or more power elements between the first gain controlled element and the second gain controlled element, such that a signal received by the pre-detection input of the second gain control device is matched with a signal received by the signal input of the second gain controlled element.

18 Claims, 8 Drawing Sheets

(51) Int. Cl.
    *H04W 24/04*    (2009.01)
    *H04W 24/06*    (2009.01)
    *H04W 28/02*    (2009.01)
    *H04W 56/00*    (2009.01)
    *H04W 88/08*    (2009.01)

(52) U.S. Cl.
    CPC ....... *H04W 24/06* (2013.01); *H04W 28/0236* (2013.01); *H04W 56/005* (2013.01); *H04W 88/08* (2013.01)

(58) Field of Classification Search
    USPC ......... 455/242.1, 243.1, 241.1, 561; 375/345
    See application file for complete search history.

(56) References Cited

U.S. PATENT DOCUMENTS

| | | | |
|---|---|---|---|
| 2001/0043417 A1* | 11/2001 | Watanabe | G11B 20/10009 360/51 |
| 2003/0194028 A1* | 10/2003 | Jeffers | H03G 3/3052 375/345 |
| 2004/0037378 A1* | 2/2004 | Komori | H03G 3/3052 375/345 |
| 2004/0091035 A1* | 5/2004 | Palaskas | H03G 1/04 375/229 |
| 2004/0097209 A1* | 5/2004 | Haub | H03G 3/001 455/242.1 |
| 2005/0141645 A1* | 6/2005 | Kim | H03D 1/24 375/326 |
| 2009/0296259 A1 | 12/2009 | Mukal et al. | |
| 2011/0044189 A1* | 2/2011 | Park | H03G 3/3078 370/252 |
| 2013/0259245 A1* | 10/2013 | Cheng | H04R 3/00 381/58 |
| 2014/0030993 A1 | 1/2014 | Kuhwald et al. | |

FOREIGN PATENT DOCUMENTS

| | | |
|---|---|---|
| DE | 102011006566 A1 | 10/2012 |
| EP | 0638998 A1 | 2/1995 |
| WO | 9221179 A1 | 11/1992 |

OTHER PUBLICATIONS

Alegre, J. P. et al., "Si Ge Analog AGC Circuit for an 802.11 a WLAN Direct Conversion Receiver", IEEE Transactions on Circuits and Systems II, Express Briefs, vol. 56, No. 2, Feb. 2009, 93-96.

* cited by examiner

METHOD AND APPARATUS FOR AUTOMATIC GAIN CONTROL

TECHNICAL FIELD

The present technology relates to the field of electronic communication, particularly to a method and apparatus for automatic gain control.

BACKGROUND

In the field such as radio communication, it is important that a receiver is able to receive a strong or a weak signal without overloading and be able to rapidly adjust to level variation in order to minimize the effective dead time of a network. Technique for doing this goes under the general name of Automatic Gain Control (AGC) and is already well established in the art. One of the most commonly used forms of AGC is the arrangement shown in FIG. 1.

As illustrated in FIG. 1, a gain controlled element, e.g. attenuator 10, has a signal input 11, a signal output 12 and a gain control input 13. A gain control device 14 has an input coupled to the output 12 of the attenuator 10 and an output coupled to the gain control input 13 of the attenuator 10. In operation, the gain control device 14 receives the signal outputted from the attenuator 10, generates a gain control signal based on the received signal, and then feeds back the gain control signal to the attenuator 10 via the gain control input 13, whereby the attenuator is able to adjust the gain itself on the basis of the gain control signal.

It is often that there are multiple gain controlled elements such as attenuator and amplifier in a receiving circuit. In this case, a plurality of gain control devices will be arranged for these gain controlled elements separately. On the other hand, it is possible that all these gain control devices are arranged to derive the signal having passed through these gain controlled elements at the end of the receiving circuit and feed the gain control signal back to the gain controlled elements. However, in this way, a plurality of power elements such as filter will be arranged between the gain control device and the gain controlled element. As known, each power element has its delay, the cumulative delay between the gain control device and the gain controlled element will lower AGC response speed. Although this is not a big problem for Global System for Mobile Communications (GSM) because the chip rate is low, it will be trouble for such as 20 MHz Long Term Evolution (LTE) system, where the chip rate is up to 30.72 MHz (32 ns per sample). In this case, if the AGC response time is longer than 500 ns, it means every time AGC state changes, over 15 samples data will be lost, which will impact Quality of Service (QoS) when AGC state update frequently due to complicated and fast variance signal/interference. System performance will be degraded obviously. Furthermore, lower AGC response speed will also cause a long glitch duration time.

SUMMARY

A first aspect of present disclosure is an automatic gain control apparatus comprising a first gain controlled element, a second gain controlled element, a first gain control device, a second gain control device and a first simulator. The first gain controlled element and the second gain controlled element each has a signal input, a gain control input and a signal output. The first gain controlled element and the second gain controlled element are coupled in series and one or more power elements are coupled between the first gain controlled element and the second gain controlled element. The signal input of the first gain controlled element constitutes an input of the automatic gain control apparatus. The first gain control device has a pre-detection input which is coupled to the signal input of the first gain controlled element and an output which drives the gain control input of the first gain controlled element. The second gain control device has a pre-detection input and an output which drives the gain control input of the second gain controlled element. The first simulator is coupled between the signal input of the first gain controlled element and the pre-detection input of the second gain control device, which is used to make a signal received by the pre-detection input of the second gain control device be matched with a signal received by the signal input of the second gain controlled element.

A second aspect of the present disclosure is a method for controlling gains of a first gain controlled element and a second gain controlled element. The two gain controlled elements are coupled in series and one or more power elements are coupled between the first gain controlled element and the second gain controlled element. The method comprises: deriving an input signal from a signal input of the first gain controlled element, wherein the input signal passes through the first gain controlled element earlier than the second gain controlled element; receiving the input signal by a first gain control device and a second gain control device; generating, by the two gain control devices, a gain control signal based on the received signal respectively; and outputting the gain control signal generated by the first gain control device to the first gain controlled element and outputting the gain control signal generated by the second gain control device to the second gain controlled element. The method further comprises pre-processing the input signal to make a signal received by the second gain control device be matched with a signal received by the second gain controlled element before the input signal arrives at the second gain control device.

As indicated, the gain control devices can derive an input signal before such signal passes through all the gain controlled elements. In this way, the undesirable time delay is eliminated from the AGC, thereby improving the AGC response speed. Moreover, a simulator is placed before the second gain control device to simulate the frequency response of the power elements between the point (e.g. the signal input of the first gain controlled element) where the gain control device derives the input signal and the point (e.g. the signal input of the second gain controlled element) where the gain controlled element is controlled by this gain control device. In this way, all the gain control devices can derive the same input signal from the same connection point (e.g. the signal input of the first gain controlled element).

A third aspect of the present disclosure is an automatic gain control apparatus comprising a gain controlled element and a gain control device. The gain controlled element has a signal input, a gain control input and a signal output. The gain control device has a pre-detection input, a post-detection input and an output. The pre-detection input is coupled to the signal input of the gain controlled element. The post-detection input is coupled to the signal output of the gain controlled element. The output drives the gain control input of the gain controlled element based on signals from the pre-detection input and the post-detection input.

A fourth aspect of the present disclosure is a method for controlling gain of a gain controlled element. The method comprises: deriving a input signal from a signal input of the gain controlled element; deriving an output signal from the signal output of the gain controlled element; generating a gain control signal based on the input signal and the output signal; and outputting the gain control signal to the gain controlled element.

Through considering both a signal to be input to the gain controlled element and a signal output from the gain controlled element, the gain control signal can be more properly provided. For example, normally the gain control signal will be generated based on the signal to be input to the gain controlled element which may assure the AGC response speed, and when exception occurs in the gain controlled element, which could cause an excessively large output signal for example, the gain control signal will be generated based on the signal output from the gain controlled element to tradeoff between the accuracy of the gain control signal provided and the AGC response speed.

A fifth aspect of the present disclosure is an automatic gain control apparatus comprising a gain controlled element, a gain control device, a first delayer and a second delayer. The gain controlled element has a signal input, a gain control input and a signal output. The gain control device has a pre-detection input and an output which drives the gain control input of the gain controlled element. The first delayer has an output coupled to the signal input of the gain controlled element and an input coupled to the pre-detection input of the gain control device. The second delayer is coupled between the output of the gain control device and the gain control input of the gain controlled element.

A sixth aspect of the present disclosure is a method for controlling gain of a gain controlled element. The method comprises: deriving an input signal from the signal input of the gain controlled element; generating a gain control signal based on the input signal; and outputting the gain control signal to the gain controlled element. The method further comprises delaying the flow of the input signal and the gain control signal towards the gain controlled element to synchronize the arrival of input signal and the gain control signal at the gain controlled element.

Through deriving the input signal at the point in front of the gain controlled element, the undesirable time delay is eliminated from the AGC, thereby improving the AGC response speed. Furthermore, the introduction of the delays can facilitate the synchronized arrival of the input signal and the corresponding gain control signal at the gain controlled element. In other words, when the input signal is received at the input of the gain controlled element, the gain control signal used for adjusting the gain of this input signal is just received at the gain control input of the gain controlled element. In this way, the gain of the gain controlled element can be adjusted more accurately.

A seventh aspect of the present disclosure is a base station comprising an automatic gain control apparatus as described above.

An eighth aspect of the present disclosure is a user equipment comprising an automatic gain control apparatus as described above.

BRIEF DESCRIPTION OF THE DRAWINGS

The technology will now be described, by way of example, based on embodiments with reference to the accompanying drawings, wherein.

DETAILED DESCRIPTION

Embodiments herein will be described more fully hereinafter with reference to the accompanying drawings, in which embodiments are shown. This embodiments herein may, however, be embodied in many different forms and should not be construed as limited to the embodiments set forth herein. The elements of the drawings are not necessarily to scale relative to each other. Like numbers refer to like elements throughout.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Also, use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Unless otherwise defined, all terms (including technical and scientific terms) used herein have the same meaning as commonly understood. It will be further understood that terms used herein should be interpreted as having a meaning that is consistent with their meaning in the context of this specification and the relevant art and will not be interpreted in an idealized or overly formal sense unless expressly so defined herein.

Embodiments herein will be described below with reference to the drawings.

Figure 1:
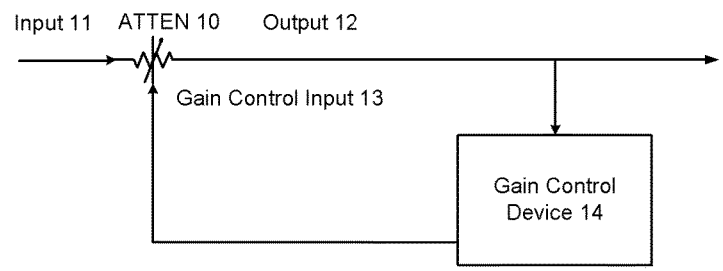
FIG. 1 illustrates a schematic view of a conventional AGC arrangement.
Figure 2:
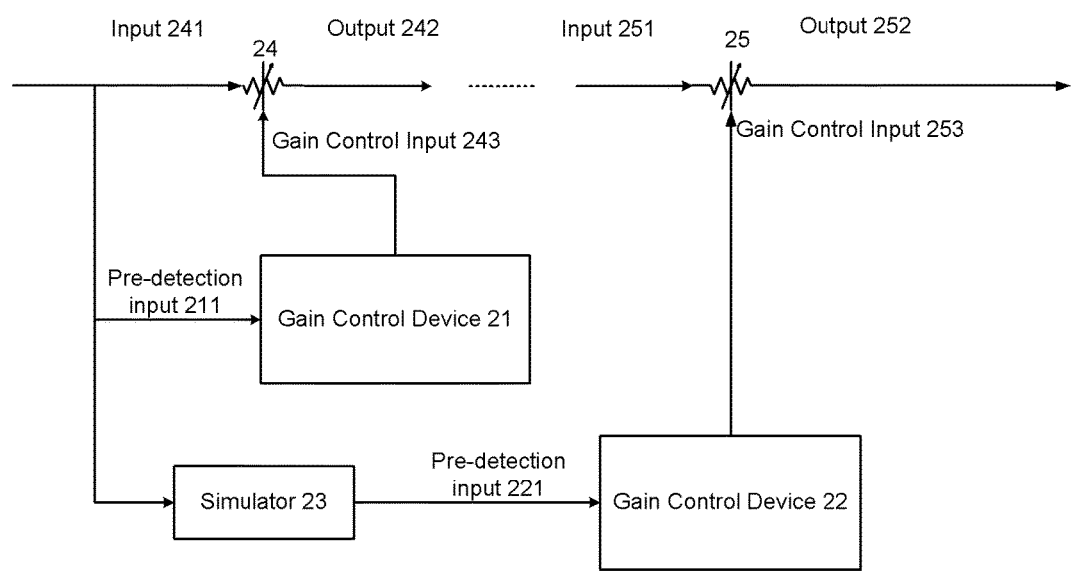
FIG. 2-7 illustrates schematic views of an AGC apparatus in accordance with an embodiment.

FIG. 2 illustrates a schematic view of an AGC apparatus in accordance with an embodiment.

As shown in FIG. 2, the automatic gain control apparatus comprises a gain controlled element 24, a gain controlled element 25, a gain control device 21, a gain control device 22 and a simulator 23.

The gain controlled element 24 has a signal input 241, a gain control input 243 and a signal output 242. Likewise, the gain controlled element 25 has a signal input 251, a gain control input 253 and a signal output 252. The gain controlled element 24 and the gain controlled element 25 are coupled in series and there are one or more power elements such as filter coupled therebetween. In operation, the one or more power elements may belong to a receiving circuit, and the gain controlled element 24 and 25 are arranged at both ends of the one or more power elements in series so as to adjust the gain of the whole receiving circuit. In the embodiment, the gain controlled element 24 is placed nearer the input of the receiving circuit than the gain controlled element 25. In other words, an input signal for the receiving circuit should pass through the gain controlled element 24, the one or more power elements and the gain controlled element 25 in order. As such, the signal input 241 of the gain controlled element 24 constitutes the input of the AGC apparatus. Herein, the gain controlled elements 24 and 25 may refer to any element whose gain is adjustable, such as attenuator, amplifier, etc.

The gain control device 21 has a pre-detection input 211 and an output. The pre-detection input 211 is coupled to the signal input 241 of the gain controlled element 24. The output of the gain control device 21 is coupled to the gain control input 243 of the gain controlled element 24. Similarly, the gain control device 22 has a pre-detection input 221 and an output. The pre-detection input 221 is also coupled to the signal input 241 of the gain controlled element 24. The output of the gain control device 22 is coupled to the gain control input 253 of the gain controlled element 25. Both the gain control devices 21 and 22 can generate a gain control signal based on the derived input signal, which will be described in detail later.

The simulator 23 is coupled between the signal input 241 of the gain controlled element 24 and the pre-detection input 221 of the gain control device 22. As indicated, power elements such as filter may exist between the gain controlled element 24 and 25, and the input signal will be processed (e.g. filtered) by these power elements before arriving at the gain controlled element 25. In this case, the input signal received by the gain controlled element 25 can not be matched with that received by the gain control device 22. As a result, the gain control device 22 may fail in providing a proper gain control signal to the gain controlled element 25. The simulator 23 is used to resolve this issue. Specifically, the simulator 23 simulates e.g. frequency response of the power elements between the gain controlled element 24 and 25, so as to make the signal received by the pre-detection input 221 of the gain control device 22 be matched with the signal received by the signal input 251 of the gain controlled element 25. As an example of "being matched", the power level of the signal received by the pre-detection input 221 of the gain control device 22 may be equal to or proportional to that of the signal received by the signal input 251 of the gain controlled element 25. However, it should be understood that the present disclosure is not limited in this regard.

In an embodiment, the simulator 23 may be a digital filter. During the operation of the AGC apparatus, if the input signal is an analog signal, this signal can be converted to a digital signal for example by an analog-to-digital converter (ADC) (not shown) in the AGC apparatus before it flows to the gain control device 21 and 22. Alternatively, in the receivers such as in the Time Division Duplex (TDD) system, the ADC in the receiving circuit may also be reused to convert the input signal for the AGC apparatus. In this case, it is not necessary to arrange additional ADC in the AGC apparatus. For the gain control device 21, the converted digital signal directly flows to the pre-detection input 211 of the gain control device 21, based on which the gain control device 21 generate and output a gain control signal to the gain controlled element 24 for adjusting its gain. For the gain control device 22, the converted digital signal firstly flows into the digital filter, i.e. the simulator 23, for filtering, and then reaches the pre-detection input 221 of the gain control device 22. In the same way, the gain control device 22 will generate and output a gain control signal to the gain controlled element 25 accordingly.

As described above, the gain control devices can derive an input signal before such signal passes through all the gain controlled elements. In this way, the undesirable time delay is eliminated from the AGC, thereby improving the AGC response speed. Moreover, a simulator is placed before the gain control device to simulate the frequency response of the power elements between the point (e.g. the signal input 241 of the gain controlled element 24) where the gain control device derives the input signal and the point (e.g. the signal input 251 of the gain controlled element 25) where the gain controlled element is controlled by this gain control device. In this way, all the gain control devices can derive the same input signal from the same connection point (e.g. the signal input 241 of the gain controlled element 24).

Figure 4:
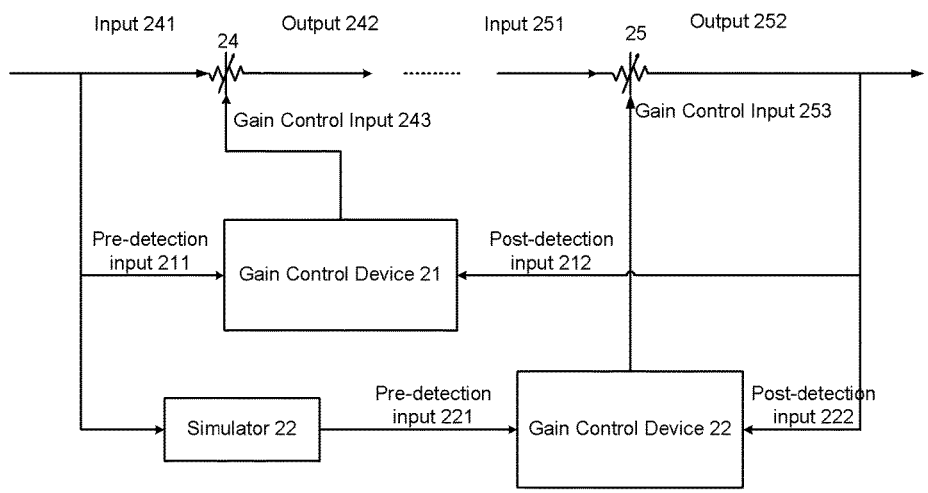

Optionally, in the AGC apparatus, the gain control device 21 may further have a post-detection input 212 which is coupled to the signal output 252 of the gain controlled element 25, as illustrated in FIG. 4. In this way, the gain control device 21 can derive both the signal flowing to the gain controlled elements 24 and 25 (hereinafter called "pre-detection signal") and the signal having passed through the gain controlled elements 24 and 25 (hereinafter called "post-detection signal"). As a result, the gain control device 21 may generate the gain control signal based on both the pre-detection signal and the post-detection signal. For example, normally the gain control device 21 may generate the gain control signal based on the pre-detection signal which guarantees the AGC response speed, and when exception occurs in the receiving circuit using the AGC apparatus, the gain control device 21 will generate the gain control signal based on the post-detection signal, so as to tradeoff between the accuracy of the gain control signal provided and the AGC response speed. The process of generating the gain control signal based on both the pre-detection signal and the post-detection signal will be described in detail later.

Similarly, the gain control device 22 may further have a post-detection input 222 which is coupled to the signal output 252 of the gain controlled element 25, as illustrated in FIG. 4. In this case, the gain control device 22 will work in the same way as the gain control device 21. Note that it is also possible that, in the AGC apparatus, some gain control devices derive both the pre-detection signal and the post-detection signal, while other gain control devices only derive the pre-detection signal.

Figure 3:
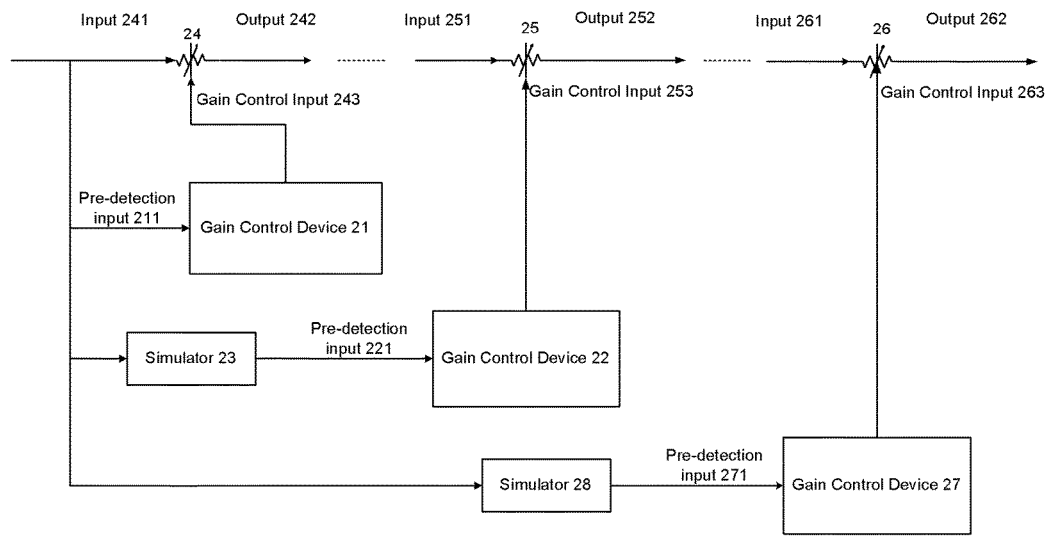

It should be appreciated that the AGC apparatus may have two or more gain control devices, and each gain control device may control one or more gain controlled elements. For example, as illustrated in FIG. 3, in addition to the elements as described by referring to the FIG. 2, the AGC apparatus may further include a gain controlled element 26, a gain control device 27 and a simulator 28. Similarly, the gain controlled element 26 has a signal input 261, a gain control input 263 and a signal output 262 and is coupled in series with the gain controlled element 24 and the gain controlled element 25. In this example, the gain controlled element 26 is arranged after the gain controlled element 25 and the power elements may exist between them. The gain control device 27 has pre-detection input 271 and an output which drives the gain control input 263 of the gain controlled element 26. The simulator 28 is coupled between the signal input 241 of the gain controlled element 24 and the pre-detection input 271 of the third gain control device 27, which functions in the same way as the simulator 23. In this way, the AGC apparatus can provide more gain control points for the receiving circuit.

Now the function of the gain control device will be discussed further by referring to the FIG. 5 and FIG. 6.

Figure 5:
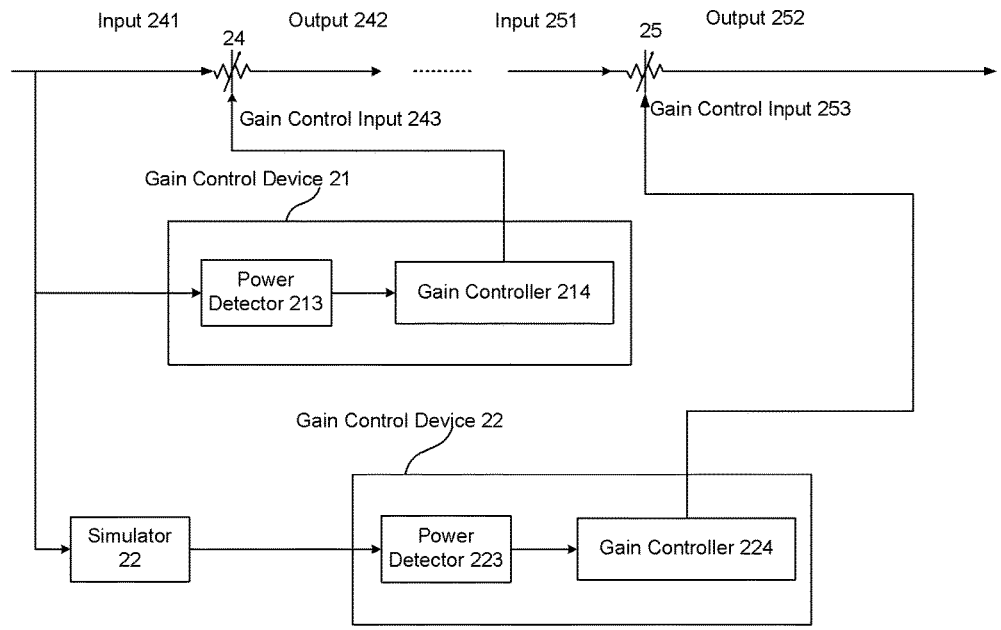

As illustrated in Fig.5, the gain control device 21 may include a pre-detection power detector 213 and a gain controller 214. The pre-detection power detector 213 has an input constituting the pre-detection input 211 of the gain control device 21. The gain controller 214 has a pre-detection input and an output, the pre-detection input is coupled to the output of the pre-detection power detector 213 and the output of the gain controller 214 constitutes the output of the gain control device 21. In operation, when the input signal arrives at the gain control device 21, the pre-detection power detector 213 may receive this signal and detect the power level of this signal, and then output the power level of this signal to the gain controller 214. After receiving the power level, the gain controller 214 may generate a gain control signal based on the power level. For example, if the power level is higher than a threshold, the gain controller 214 may generate a gain control signal indicating to decrease the gain of the gain controlled element. Otherwise, if the power level is lower than a threshold, the gain controller 214 may generate a gain control signal indicating to increase the gain of the gain controlled element.

Similarly, the gain control device 22 may include a pre-detection power detector 223 and a gain controller 224. They perform the same function as the pre-detection power detector 213 and the gain controller 214, which will not be repeatedly described for conciseness.

Figure 6:
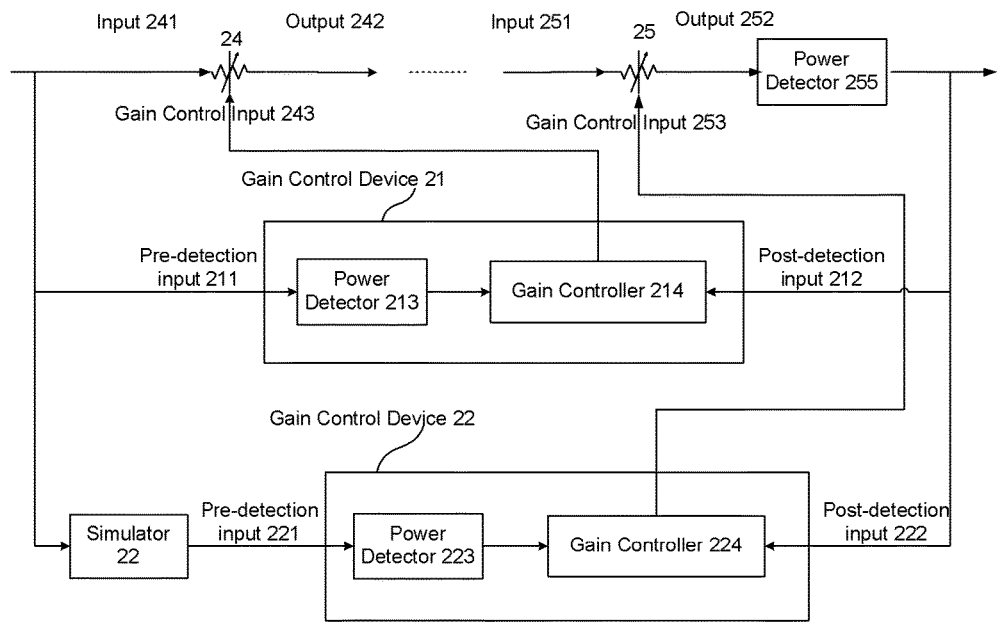

Furthermore, as illustrated in Fig.6, in the case that the gain control devices derive both the pre-detection signal and the post-detection signal, the AGC apparatus may further include a post-detection power detector 255, which has an input coupled to the signal output 252 of the gain controlled element 25 and an output coupled to the post-detection input 212 of the gain control device 21 and the post-detection input 222 of the gain control device 22. As such, each of the gain controllers 214 and 224 of the gain control device 21 and the gain control device 22 may further have a post-detection input, which constitutes the post-detection input of the corresponding gain controller device.

The post-detection power detector 255 functions as detecting the power level of the post-detection signal and outputting the power level to the gain control device 21 and 22. Taking the gain control device 21 as example, when receiving the power level of the pre-detection signal from the pre-detection power detector 213 and the power level of the post-detection signal from the post-detection power detector 255, the gain controller 214 may firstly check the power level of the post-detection signal to determine if there is abnormality in the receiving circuit using the AGC apparatus. For example, an abnormal power level may indicate that a failure occurs in some power element between the gain controlled element 21 and the gain controlled element 22 in the receiving circuit. If it is determined that the receiving circuit works well (e.g. no abnormal power level from the post-detection signal), then the gain controller 214 may generate the gain control signal using the power level of the pre-detection signal. If there is abnormality in the receiving circuit, the pre-detection signal won't properly reflect the signal received by the gain controlled element 24, and in this case, the gain controller 214 may generate the gain control signal using the power level of the post-detection signal instead.

In the above embodiment, a separate post-detection power detector is arranged to provide the power level of the post-detection signal to the gain control devices, but it should be understood that such post-detection power detector may also be integrated into the individual gain control devices.

Optionally, in order to provide a stable gain control signal to the gain controlled element, the gain controller 212 and 222 may be configured to generate the gain control signal based on the received power levels during a time period. For example, the gain controller may generate the gain control signal using the average value of the received power levels during a time period, instead of an instantaneous value.

Optionally, it is desirable for the gain control device to provide accurate gain control signal for the gain controlled element. One way is to synchronize the arrival of the input signal and the corresponding gain control signal at the gain controlled element. In this way, the gain controlled element can adjust the gain of the input signal using the gain control signal generated from the signal being matched with the input signal.

Figure 7:
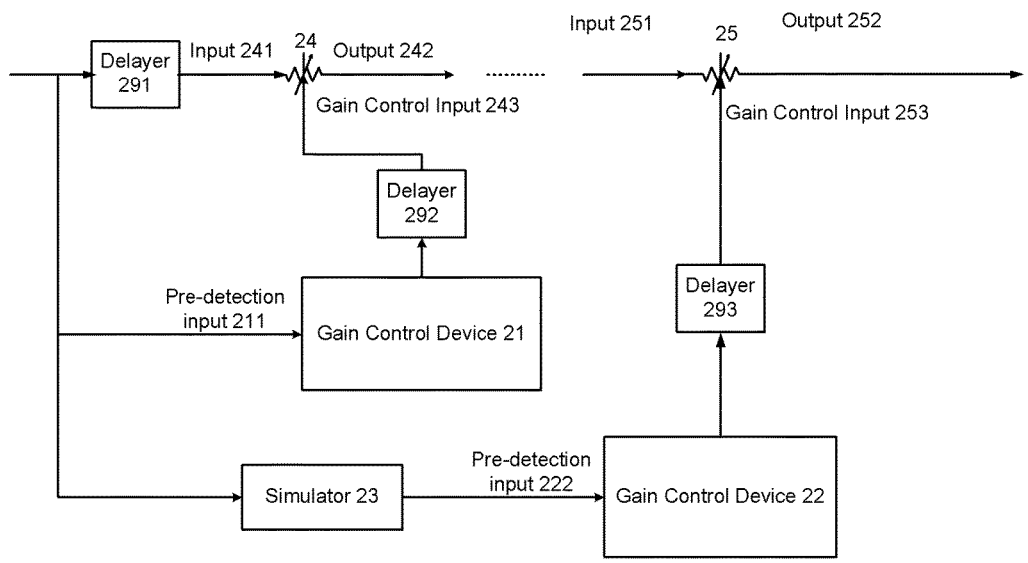

For example, as illustrated in FIG. 7, the AGC apparatus may further comprise a delayer 291, a delayer 292 and a delayer 293. The delayer 291 has an output coupled to the signal input 241 of the gain controlled element 24 and an input coupled to the pre-detection inputs of the gain control device 21 and 22. The delayer 292 is coupled between the output of the gain control device 21 and the gain control input 243 of the gain controlled element 24. Similarly, the delayer 293 is coupled between the output of the gain control device 22 and the gain control input 253 of the gain controlled element 25. The delayer 292 and 293 are adjustable delayers such as a delay line. As indicated, through adjusting the delay of the delayers 292 and 293, they can work with the delayer 291 to enable the input signal to the gain controlled element 24 and 25 and the gain control signal used for specially adjusting the gain of this input signal to arrive at the gain controlled element 24 and 25 at the same time. In other words, while the input signal is received at the signal input of the gain controlled element, the corresponding gain control signal is just received at the gain control input of the gain controlled element.

Figure 8:
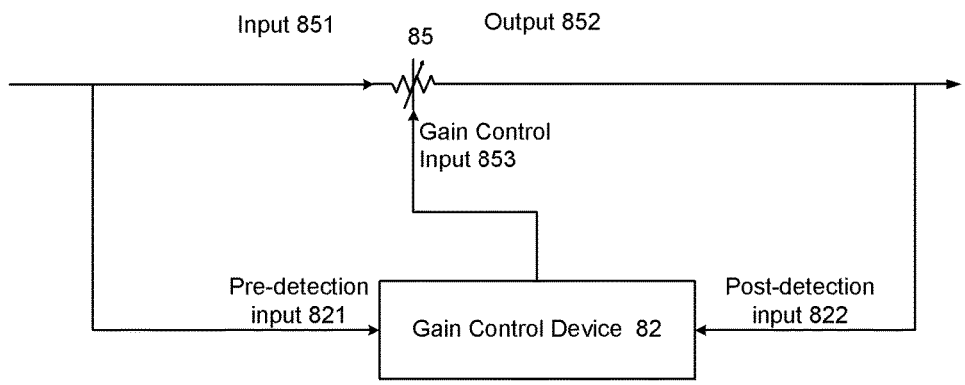
FIG. 8-9 illustrates schematic views of an AGC apparatus in accordance with another embodiment.

FIG. 8 illustrates a schematic view of an AGC apparatus in accordance with another embodiment.

As shown in FIG. 8, the automatic gain control apparatus comprises a gain controlled element 85 and a gain control device 82. The gain controlled element 85 has a signal input 851, a gain control input 853 and a signal output 852. The gain control device 82 has a pre-detection input 821, a post-detection input 822 and an output. The pre-detection input 821 is coupled to the signal input 851 of the gain controlled element 85. The post-detection input 822 is coupled to the signal output 852 of the gain controlled element 85. The output of the gain control device 82 is coupled to the gain control input 853 of the gain controlled element 85. As indicated, the gain controlled element 85 and gain control device 82 is comparable to the gain controlled element 24 and gain control device 21 in FIG. 4.

In operation, the gain control device 82 can derive both the input signal of the gain controlled element 85 and the output signal of the gain controlled element 85. As a result, the gain control device 82 may generate the gain control signal based on both the input signal and the output signal of the gain controlled element 85. For example, normally the gain control device 82 may generate the gain control signal based on the input signal of the gain controlled element 85 which guarantees the AGC response speed, and when exception occurs in the gain controlled element 85, the gain control device 85 will generate the gain control signal based on the output signal of the gain controlled element 85, so as to tradeoff between the accuracy of the gain control signal provided and the AGC response speed. In this way, the gain control signal can be more properly generated.

Figure 9:
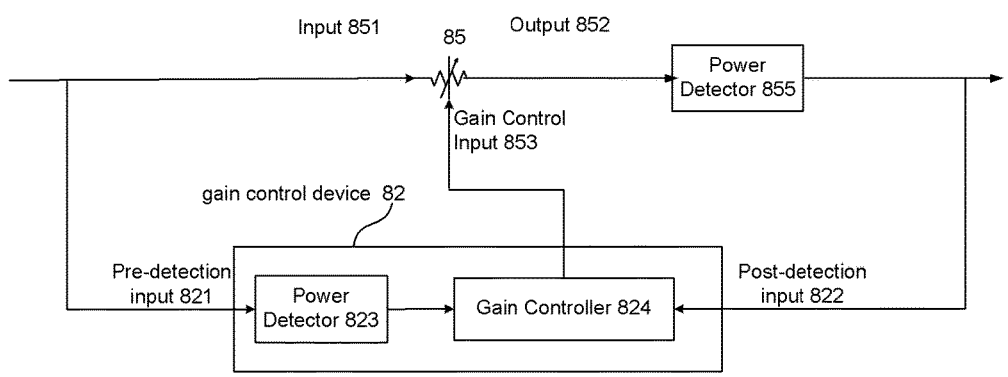

In order that the gain control device 82 can generate the gain control signal based on both the input signal and the output signal of the gain controlled element 85, in an embodiment as illustrated in FIG. 9, the AGC apparatus may further include a post-detection power detector 855, which has an input coupled to the signal output 852 of the gain controlled element 85 and an output coupled to the post-detection input 824 of the gain control device 82. Accordingly, the gain control device 82 may include a pre-detection power detector 823 and a gain controller 824. The pre-detection power detector 823 has an input constituting the pre-detection input 821 of the gain control device 82. The gain controller 824 has pre-detection input coupled to an output of the pre-detection power detector 823 and a post-detection input constituting the post-detection input 822 of the gain controller device 82.

In this embodiment, the post-detection power detector 855 functions as detecting the power level of the output signal of the gain controlled element 85 and outputting the resulting power level (hereinafter called "post-detection power level") to the gain controller 824. Also, the pre-detection power detector 823 functions as detecting the power level of the input signal of the gain controlled element 85 and outputting the resulting power level (hereinafter called "pre-detection power level") to the gain controller 824. When receiving the pre-detection power level from the pre-detection power detector 823 and the post-detection power level from the post-detection power detector 855, the gain controller 824 may firstly check the post-detection power level to determine if there is abnormality in the gain controlled element 85. For example, an abnormal power level may indicate the malfunction of the gain controlled element 85. If it is determined that gain controlled element 85 works well, then the gain controller 824 may generate the gain control signal using the pre-detection power level. Otherwise, the gain controller 824 may generate the gain control signal using the post-detection power level instead.

In the above embodiment, a separate post-detection power detector 855 is arranged to provide the post-detection signal power level to the gain control device 82, but it should be understood that such post-detection power detector may also be integrated into the gain control device 82.

Figure 10:
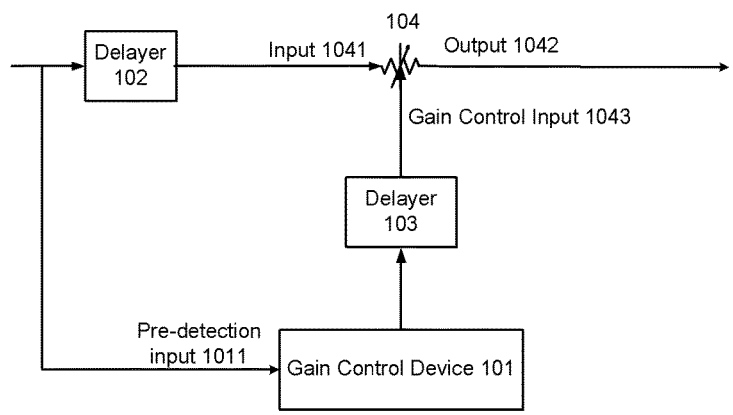
FIG. 10-12 illustrates schematic views of an AGC apparatus in accordance with a further embodiment.

FIG. 10 illustrates a schematic view of an AGC apparatus in accordance with a further embodiment.

As shown in FIG. 10, the AGC apparatus includes a gain controlled element 104, a gain control device 101, a delayer 102 and a delayer 103.

The gain controlled element 104 has a signal input 1041, a gain control input 1043 and a signal output 1042. The gain control device 101 has a pre-detection input 1011 and an output coupled to the gain control input 1043 of the gain controlled element 104. During the operation of the AGC apparatus, the gain control device 101 may derive the input signal of the gain controlled element 104, generate a gain control signal based on the received input signal, and then output the gain control signal to the gain controlled element 24. After getting the gain control signal, the gain controlled element 24 may adjust the gain of its input signal according to the gain control signal.

The delayer 102 has an output coupled to the signal input 1041 of the gain controlled element 104 and an input coupled to the pre-detection input 1011 of the gain control device 101. The delayer 103 is coupled between the output of the gain control device 101 and the gain control input 1043 of the gain controlled element 104. The delayers 102 and 103 can be adjustable delayer such as delay line. For example, through adjusting the delay of the delayer 103, it can work with delayer 102 to enable the input signal and the gain control signal used for specially adjusting the gain of this input signal to arrive at the gain controlled element 104 at the same time.

Through deriving the input signal at the point in front of the gain controlled element, the undesirable time delay is eliminated from the AGC, thereby improving the AGC response speed. Furthermore, the introduction of the delays can facilitate the synchronized arrival of the input signal and the corresponding gain control signal at the gain controlled element. In other words, when the input signal is received at the input of the gain controlled element, the gain control signal used for adjusting the gain of this input signal is just received at the gain control input of the gain controlled element. In this way, the gain of the gain controlled element can be adjusted more accurately.

Figure 11:
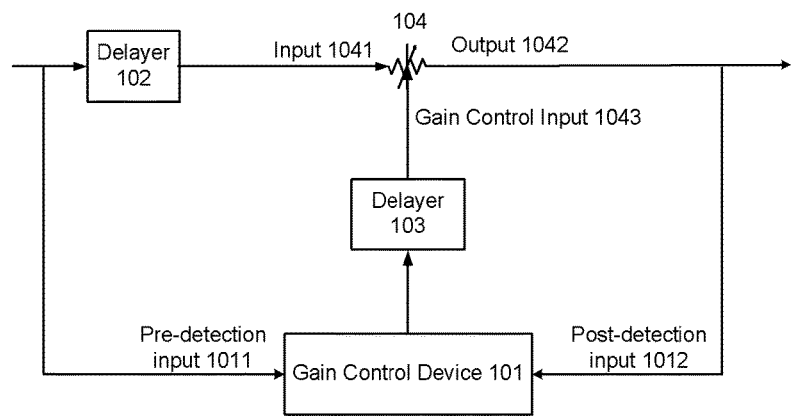

Optionally, the gain control device 101 may further have a post-detection input 1012, which is coupled to the signal output 1042 of the gain controlled element 104 as illustrated in FIG. 11. In this way, the gain control device 101 can derive both the input signal of the gain controlled element 104 and the output signal of the gain controlled element 104. As a result, the gain control device 101 may generate the gain control signal based on both the input signal and the output signal of the gain controlled elements 104. For example, normally the gain control device 101 may generate the gain control signal based on the input signal of the gain controlled element 104 which guarantees the AGC response speed, and when exception occurs in the gain controlled element 104, the gain control device 101 will generate the gain control signal based on the output signal of the gain controlled element 104, so as to tradeoff between the accuracy of the gain control signal provided and the AGC response speed. In this way, the gain control signal can be more properly generated.

Figure 12:
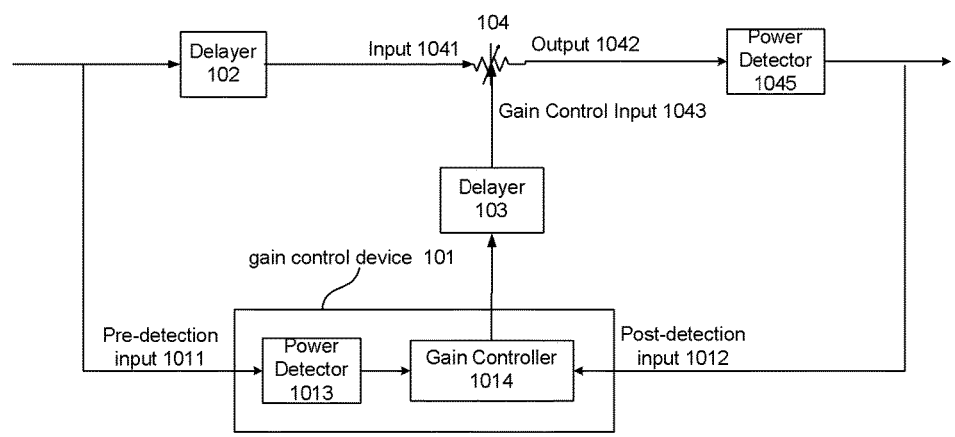

In order that the gain control device 101 can generate the gain control signal based on both the input signal and the output signal of the gain controlled element 104, in an embodiment as illustrated in FIG. 12, the AGC apparatus may further include a post-detection power detector 1045, which has an input coupled to the signal output 1042 of the gain controlled element 104 and an output coupled to the post-detection input 1012 of the gain control device 101. Accordingly, the gain control device 101 may include a pre-detection power detector 1013 and a gain controller 1014. The pre-detection power detector 1013 has an input constituting the pre-detection input 1011 of the gain control device 101. The gain controller 1014 has pre-detection input coupled to an output of the pre-detection power detector 1013 and a post-detection input constituting the post-detection input 1012 of the gain controller device 101.

In this embodiment, the post-detection power detector 1045 functions as detecting the power level of the output signal of the gain controlled element 104and outputting the resulting power level (hereinafter called "post-detection power level") to the gain controller 1014. Also, the pre-detection power detector 1013 functions as detecting the power level of the input signal of the gain controlled element 104 and outputting the resulting power level (hereinafter called "pre-detection power level") to the gain controller 1014. When receiving the pre-detection power level from the pre-detection power detector 1013 and the post-detection power level from the post-detection power detector 1045, the gain controller 1014 may firstly check the pre-detection power level to determine if there is abnormality in the gain controlled element 104. For example, an abnormal power level may indicate the malfunction of the gain controlled element 104. If it is determined that gain controlled element 85 works as expected, then the gain controller 1014 may generate the gain control signal using the pre-detection power level. Otherwise, the gain controller 824 may generate the gain control signal using the post-detection power level instead.

Figure 13:
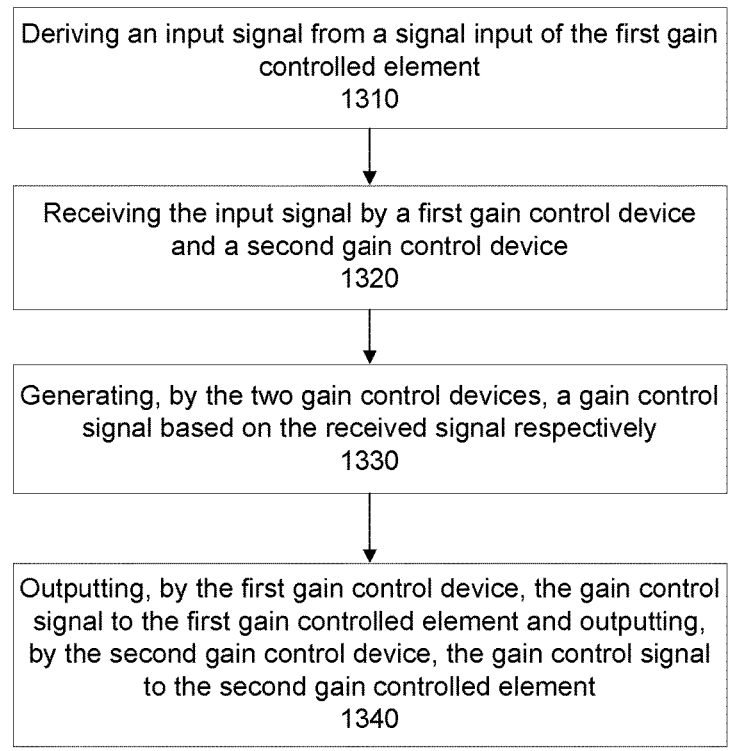
FIG. 13 schematically illustrates a flowchart of controlling gains of gain controlled elements in accordance with an embodiment.

FIG. 13 schematically illustrates a flowchart of controlling gains of gain controlled elements in accordance with an embodiment. Now the process for controlling gains of gain controlled elements by an AGC apparatus will be described with reference to FIG. 2 and FIG. 13.

As shown in FIG. 2, the AGC apparatus attempts to control the gain of a gain controlled element 24 and a gain controlled element 25. In practice, the gain controlled element 24 and 25 will for example be integrated into a receiving circuit, where they are coupled in series and one or more power elements are coupled between them.

In block 1310, the AGC apparatus derives an input signal from the receiving circuit before the input signal passes through the gain controlled element 24 and 25. Specifically, since the input signal will arrive at the gain controlled element 24 firstly and then the gain controlled element 25 as shown in FIG. 2, the AGC apparatus may derive the input signal from the signal input of the gain controlled element 24.

In block 1320, the gain control device 21 and the gain control device 22 in the AGC apparatus receive the derived input signal in the AGC apparatus respectively. For the gain control device 21, it can directly receive the input signal. For the gain control device 22, before being received by the gain control device 22, the input signal needs to be processed to simulate frequency response of the one or more power elements between the gain controlled element 24 and the gain controlled element 25, so as to make the signal received by the pre-detection input of the gain control device 22 be matched with the signal received by the signal input 251 of the gain controlled element 25.

In block 1330, the gain control devices 21 and 22 in the AGC apparatus generate a gain control signal based on the received signal respectively. For example, if the power level of the received signal is higher than a threshold, the gain control device may generate a gain control signal indicating decrease of the gain of the gain controlled element. Otherwise, if the power level of the received signal is lower than a threshold, the gain control device may generate a gain control signal indicating increase of the gain of the gain controlled element.

In block 1340, the AGC apparatus outputs the gain control signal generated by the gain control device 21 to the gain controlled element 24, and output the gain control signal generated by the gain control device 22 to the gain controlled element 25.

Here, the AGC apparatus functions to control the gains of two gain controlled elements, for example, in a receiving circuit, but it is also possible that the AGC apparatus is configured to control the gains of two or more gain controlled elements in the receiving circuit in the similar way as above.

As indicated, the AGC apparatus can derive an input signal before such signal passes through all the gain controlled elements. In this way, the undesirable time delay is eliminated from the AGC, thereby improving the AGC response speed. Moreover, through simulating the frequency response of the power elements between the point where the AGC apparatus derives the input signal and the gain controlled element being controlled by this AGC apparatus, all the gain control devices can derive the same input signal from the same connection point.

Figure 14:
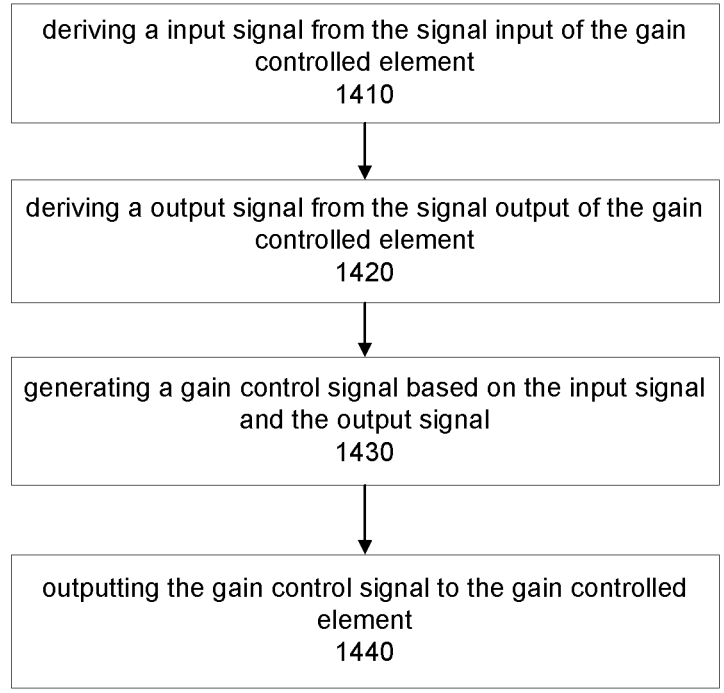
FIG. 14 schematically illustrates a flowchart of controlling gains of a gain controlled element in accordance with another embodiment.

FIG. 14 schematically illustrates a flowchart of controlling gains of a gain controlled element in accordance with another embodiment. Now the process for controlling gain of a gain controlled elements by an AGC apparatus will be described with reference to FIG. 8 and FIG. 14.

As shown in FIG. 8, the AGC apparatus attempts to control the gain of a gain controlled element 85. In practice, the gain controlled element 85 will for example be integrated into a receiving circuit.

In block 1410, the AGC apparatus derives an input signal from the signal input of the gain controlled element 85.

In block 1420, the AGC apparatus derives an output signal from the signal output of the gain controlled element 85.

In block 1430, the AGC apparatus generates a gain control signal based on the input signal and the output signal of the gain controlled element 85. As an example, the AGC apparatus may firstly detect a power level of the input signal and a power level of the output signal. Then, the AGC apparatus may check the power level of the output signal to determine if there is abnormality in the gain controlled element 85. An abnormal power level may indicate the malfunction of the gain controlled element 85. If it is determined that gain controlled element 85 works well, then the AGC apparatus may generate the gain control signal using the power level of the input signal. Otherwise, the AGC apparatus may generate the gain control signal using the power level of the output signal instead. In the course of generating the gain control signal, if the power level is higher than a threshold, the AGC apparatus may generate a gain control signal indicating decrease of the gain of the gain controlled element. Otherwise, if the power level is lower than a threshold, the AGC apparatus may generate a gain control signal indicating increase of the gain of the gain controlled element.

In block 1440, the AGC apparatus may output the gain control signal to the gain controlled element 85. As such, the gain controlled element 85 can adjust the gain of the input signal received by this gain controlled element based on the gain control signal.

Through considering both a signal to be input to the gain controlled element and a signal output from the gain controlled element, the gain control signal can be more properly provided. For example, normally the gain control signal will be generated based on the signal to be input to the gain controlled element which may assure the AGC response speed, and when exception occurs in the gain controlled element, the gain control signal will be generated based on the signal output from the gain controlled element to tradeoff between the accuracy of the gain control signal provided and the AGC response speed.

Figure 15:
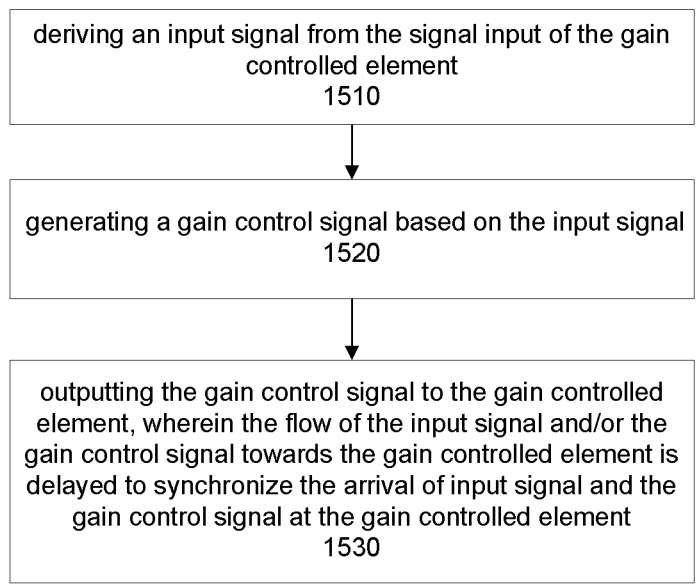
FIG. 15 schematically illustrates a flowchart of controlling gains of a gain controlled element in accordance with a further embodiment.

FIG. 15 schematically illustrates a flowchart of controlling gains of a gain controlled element in accordance with a further embodiment. Now the process for controlling gain of a gain controlled element by an AGC apparatus will be described with reference to FIG. 10 and FIG. 14.

As shown in FIG. 10, the AGC apparatus attempts to control the gain of a gain controlled element 104. In practice, the gain controlled element 104 will for example be integrated into a receiving circuit.

In block 1510, the AGC apparatus derives an input signal from the signal input of the gain controlled element 104.

In block 1520, the AGC apparatus generates a gain control signal based on the input signal. For example, the AGC apparatus may detect the power level of the input signal. If the power level is higher than a threshold, the AGC apparatus may generate a gain control signal indicating decrease the gain of the gain controlled element. Otherwise, if the power level is lower than a threshold, the AGC apparatus may generate a gain control signal indicating increase the gain of the gain controlled element.

In block 1530, the AGC apparatus outputs the gain control signal to the gain controlled element 104. When outputting the gain control signal, the AGC apparatus may delay the flow of the input signal and/or the gain control signal (generated based on the input signal) towards the gain controlled element 104, so as to synchronize the arrival of input signal and the gain control signal at the gain controlled element.

Through deriving the input signal at the point in front of the gain controlled element, the undesirable time delay is eliminated from the AGC, thereby improving the AGC response speed. Furthermore, the introduction of the delay can facilitate the synchronized arrival of the input signal and the corresponding gain control signal at the gain controlled element. In other words, when the input signal is received at the input of the gain controlled element, the gain control signal used for adjusting the gain of this input signal is just received at the gain control input of the gain controlled element. In this way, the gain of the gain controlled element can be adjusted more accurately.

While the embodiments have been illustrated and described herein, it will be understood by those skilled in the art that various changes and modifications may be made, any equivalents may be substituted for elements thereof without departing from the true scope of the present technology. In addition, many modifications may be made to adapt to a particular situation and the teaching herein without departing from its central scope. Therefore it is intended that the present embodiments not be limited to the particular embodiment disclosed as the best mode contemplated for carrying out the present technology, but that the present embodiments include all embodiments falling within the scope of the appended claims.

The invention claimed is:

1. An automatic gain control apparatus comprising:
   a first gain controlled element and a second gain controlled element, each of which has a signal input, a gain control input and a signal output, wherein the first gain controlled element and the second gain controlled element are coupled in series, with one or more power elements coupled therebetween, and wherein the signal input of the first gain controlled element constitutes an input of the automatic gain control apparatus;
   a first gain control device, having a pre-detection input which is coupled to the signal input of the first gain controlled element and an output which drives the gain control input of the first gain controlled element;
   a second gain control device, having a pre-detection input and having an output which drives the gain control input of the second gain controlled element; and
   a first simulator, coupled between the signal input of the first gain controlled element and the pre-detection input of the second gain control device, the first simulator being configured to make a signal received by the pre-detection input of the second gain control device be matched with a signal received by the signal input of the second gain controlled element.

2. The apparatus of claim 1, further comprising:
   a third gain controlled element, having a signal input, a gain control input and a signal output, wherein the third gain controlled element is coupled in series with the first gain controlled element and the second gain controlled element,
   a third gain control device, having a pre-detection input and an output which drives the gain control input of the third gain controlled element, and
   a second simulator, coupled between the signal input of the first gain controlled element and the pre-detection input of the third gain control device, the second simulator being configured to make a signal received by the third gain control device be matched with a signal received by the signal input of the third gain controlled element.

3. The apparatus of claim 1, wherein the signal output of the second gain controlled element is coupled to a post-detection input of the first gain control device and a post-detection input of the second gain control device.

4. The apparatus of claim 3, wherein each of the first gain control device and the second gain control device comprises:
   a pre-detection power detector, having an input constituting the pre-detection input of the gain control device, the pre-detection power detector being configured to detect and output a power level of a signal received at the input of the pre-detection power detector,
   a gain controller, having a pre-detection input coupled to an output of the pre-detection power detector and an output constituting the output of the gain control device, the gain controller being configured to generate a gain control signal based on the power level received from the pre-detection power detector.

5. The apparatus of claim 4, further comprising:
   a post-detection power detector, having an input coupled to the signal output of the second gain controlled element and an output coupled to the post-detection input of the first gain control device and the post-detection input of the second gain control device, the post-detection power detector being configured to detect and output a power level of a signal received at the input of the post-detection power detector, wherein each of the gain controllers of the first gain control device and the second gain control device further has a post-detection input constituting the post-detection input of the corresponding gain controller device, each gain controller being configured to generate the respective gain control signal based on the power level received from the pre-detection power detector and the post-detection power detector.

6. The apparatus of claim 4, wherein in each of the first gain control device and the second gain control device, the gain controller is configured to generate the gain control signal based on the received power level during a time period.

7. The apparatus of claim 1, further comprising:
   a first delayer having an output coupled to the signal input of the first gain controlled element, and an input coupled to the pre-detection input of the first gain control device and the second gain control device, and
   a second delayer coupled between the output of the first gain control device and the gain control input of the first gain controlled element, and
   a third delayer coupled between the output of the second gain control device and the gain control input of the second gain controlled element.

8. The apparatus of claim 1, wherein the simulator is a digital filter.

9. A base station comprising an automatic gain control apparatus according to claim 1.

10. A user equipment comprising an automatic gain control apparatus according to claim 1.

11. An automatic gain control apparatus comprising:
- a gain controlled element, having a signal input, a gain control input and a signal output;
- a gain control device, having a pre-detection input which is coupled to the signal input of the gain controlled element, a post-detection input which is coupled to the signal output of the gain controlled element and an output which drives the gain control input of the gain controlled element based on signals from the pre-detection input and the post-detection input; and
- a post-detection power detector, having an input coupled to the signal output of the gain controlled element and configured to detect and output a power level of a signal received at the input of the post detection power detector, and having an output coupled to the post-detection input of the gain control device, wherein the gain control device comprises:
- a pre-detection power detector, having an input constituting the pre-detection input of the gain control device, and configured to detect and output a power level of a signal received at the input of the pre-detection power detector, and
- a gain controller, having a pre-detection input coupled to an output of the pre-detection power detector and a post-detection input constituting the post-detection input of the gain control device, the gain controller being configured to generate a gain control signal based on the power level received from the pre-detection power detector and the post-detection power detector and having an output constituting the output of the gain control device.

12. An automatic gain control apparatus comprising:
- a gain controlled element, having a signal input, a gain control input and a signal output;
- a gain control device, having a pre-detection input and an output which drives the gain control input of the gain controlled element;
- a first delayer, having an output coupled to the signal input of the gain controlled element, and an input coupled to the pre-detection input of the gain control device; and
- a second delayer, coupled between the output of the gain control device and the gain control input of the gain controlled element.

13. The apparatus of claim 12, wherein the signal output of the gain controlled element is coupled to a post-detection input of the gain control device.

14. The apparatus of claim 13, further comprising:
- a post-detection power detector, having an input coupled to the signal output of the gain controlled element to detect and output a power level of a received signal and an output coupled to the post-detection input of the gain control device, wherein the gain control device comprises:
- a pre-detection power detector, having an input constituting the pre-detection input of the gain control device, the pre-detection power detector being configured to detect and output a power level of a signal received at the input of the pre-detection power detector, and
- a gain controller, having a pre-detection input coupled to an output of the pre-detection power detector and a post-detection input constituting the post-detection input of the gain controller device, the gain controller being configured to generate a gain control signal based on the power level received from the pre-detection power detector and the post-detection power detector, the gain controller further having an output constituting the output of the gain control device.

15. A method for controlling gains of a first gain controlled element and a second gain controlled element, wherein the two gain controlled elements are coupled in series, with one or more power elements coupled therebetween, the method comprising:
- deriving an input signal from a signal input of the first gain controlled element, wherein the input signal passes through the first gain controlled element earlier than the second gain controlled element;
- receiving the input signal by a first gain control device and a second gain control device;
- generating, by the two gain control devices, a gain control signal based on the received signal respectively; and
- outputting the gain control signal generated by the first gain control device to the first gain controlled element and outputting the gain control signal generated by the second gain control device to the second gain controlled element;
- wherein the method further comprises, before the input signal arrives at the second gain control device, pre-processing the input signal to make a signal received by the second gain control device be matched with a signal received by the second gain controlled element.

16. A method for controlling gain of a gain controlled element comprising:
- deriving an input signal from a signal input of the gain controlled element, wherein deriving the input signal comprises detecting a power level of the signal input of the gain controlled element, the input signal being the detected power level of the signal input;
- deriving an output signal from the signal output of the gain controlled element, wherein deriving the output signal comprises detecting a power level of the signal output of the gain controlled element, the output signal being the detected power level of the signal output;
- generating a gain control signal based on the input signal and the output signal; and
- outputting the gain control signal to the gain controlled element.

17. The method of claim 16, wherein the generating the gain control signal comprises, the output signal indicates an abnormality of the gain controlled element, generating the gain control signal based on the output signal and otherwise generating the gain control signal based on the input signal.

18. A method for controlling gain of a gain controlled element comprising:
- deriving an input signal from the signal input of the gain controlled element;
- generating a gain control signal based on the input signal; and
- outputting the gain control signal to the gain controlled element;
- wherein the flow of the input signal and/or the gain control signal towards the gain controlled element is delayed to synchronize the arrival of input signal and the gain control signal at the gain controlled element.

* * * * *